US010284202B1

(12) United States Patent
Gunn

(10) Patent No.: US 10,284,202 B1
(45) Date of Patent: May 7, 2019

(54) GENERATING ANALOG OUTPUT FROM A FIELD PROGRAMMABLE GATE ARRAY BY COMBINING SCALED DIGITAL OUTPUTS

(71) Applicant: RAYTHEON COMPANY, Waltham, MA (US)

(72) Inventor: Brian A. Gunn, Goleta, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/943,534

(22) Filed: Apr. 2, 2018

(51) Int. Cl.
*H03K 19/177* (2006.01)
*H04L 27/36* (2006.01)

(52) U.S. Cl.
CPC . *H03K 19/17744* (2013.01); *H03K 19/17788* (2013.01); *H04L 27/36* (2013.01)

(58) Field of Classification Search
None
See application file for complete search history.

(56) References Cited

U.S. PATENT DOCUMENTS

| 8,385,469 | B2 | 2/2013 | Wang et al. | |
|---|---|---|---|---|
| 2010/0117727 | A1* | 5/2010 | Dawson | H03F 1/0244 330/124 R |
| 2011/0273236 | A1* | 11/2011 | Heijden | H03F 1/0294 330/295 |
| 2013/0016795 | A1 | 1/2013 | Kunihiro et al. | |
| 2014/0118065 | A1* | 5/2014 | Briffa | H03F 1/025 330/129 |

FOREIGN PATENT DOCUMENTS

| CN | 102362472 A | 2/2012 |
|---|---|---|
| WO | WO 2011/091028 A1 | 7/2011 |
| WO | WO 2012/164876 A1 | 12/2012 |

OTHER PUBLICATIONS

Cordeiro, R. F. et al., "Agile All-Digital RF Transceiver Implemented in FPGA", IEEE Transactions on Microwave Theory and Techniques, Nov. 2017, pp. 4229-4240, vol. 65, No. 11, IEEE.
Kester, Walt, "Basic DAC Architectures II: Binary DACs", MT-015 Tutorial, 2009, pp. 1-10, Analog Devices, Inc.
Kulka, Zbigniew, et al., "An FPGA-based Sigma-Delta Audio DAC", Jul. 29, 2011, IEEE.
Li, Xiaoxiao et al., "An FPGA Implemented 24-bit Audio DAC with 1-bit Sigma-Delta Modulator", 2010, pp. 768-771, IEEE.
Markert, Daniel et al., "An All-Digital, Single-Bit RF Transmitter for Massive MIMO", IEEE Transactions on Circuits and Systems-I: Regular Papers, Mar. 2017, pp. 696-704, vol. 64, No. 3, IEEE.

(Continued)

*Primary Examiner* — Jany Richardson
(74) *Attorney, Agent, or Firm* — Lewis Roca Rothgerber Christie LLP

(57) ABSTRACT

A system for generating analog output from a field programmable gate array. The field programmable gate array has a plurality of digital transceivers, each including a transmitter with an output drive circuit having a programmable output voltage swing. Two or more of the transmitters are programmed to have output voltage swings differing from each other by about a factor of two. A circuit that operates as a digital to analog converter is formed by combining the outputs of the transmitters, using a power combiner.

19 Claims, 7 Drawing Sheets

(56) References Cited

OTHER PUBLICATIONS

Melo, Cecil Accetti R. de A. et al., "FPGA-based Digital Direct-Conversion Transceiver for Nuclear Magnetic Resonance Systems", 2012, 5 pages, IEEE.
Ye, Zhuan et al., "An FPGA Based All-Digital Transmitter with Radio Frequency Output for Software Defined Radio", 2007, pp. 1-6, EDAA.
"Zynq UltraScale+ RFSoC Data Sheet: Overview", XILINX All Programmable, Advance Product Specification, Jan. 23, 2018, pp. 1-33.

* cited by examiner

GENERATING ANALOG OUTPUT FROM A FIELD PROGRAMMABLE GATE ARRAY BY COMBINING SCALED DIGITAL OUTPUTS

FIELD

One or more aspects of embodiments according to the present invention relate to field programmable gate arrays, and more particularly to a low cost and low mass system for generating analog output from a field programmable gate array.

BACKGROUND

Field programmable gate arrays find use in various commercial and military applications, and in a significant proportion of such applications, an analog voltage is generated under the control of the field programmable gate array. Related art methods of generating analog output from a field programmable gate array include using an internal digital to analog converter present in some field programmable gate arrays, or using an external digital to analog converter, driven by a digital control signal generated by the field programmable gate array.

The internal digital to analog converter present in some field programmable gate arrays may lack the performance needed for some applications, and the number such outputs may be insufficient. Using one or more external digital to analog converters may considerably increase the cost, size, power consumption, and mass of a system, especially when high performance (e.g., high speed) digital to analog converters are used.

Thus, there is a need for an improved system for generating analog output from a field programmable gate array.

SUMMARY

Aspects of embodiments of the present disclosure are directed toward a system for generating analog output from a field programmable gate array. The field programmable gate array has a plurality of digital transceivers, each including a transmitter with an output drive circuit having a programmable output voltage swing. Two or more of the transmitters are programmed to have output voltage swings differing from each other by about a factor of two. A circuit that operates as a digital to analog converter is formed by combining the outputs of the transmitters, using a power combiner.

According to an embodiment of the present invention there is provided a analog signal generator, including: a field-programmable gate array including: a first output drive circuit connected to a first output of the field-programmable gate array; and a second output drive circuit connected to a second output of the field-programmable gate array; and a power combiner having: an output, a first input connected to the first output of the field-programmable gate array, and a second input connected to the second output of the field-programmable gate array, each of the first output drive circuit and the second output drive circuit having a programmable output voltage swing, the first output drive circuit being programmed to have an output voltage swing greater than the output voltage swing of the second output drive circuit.

In one embodiment, the first output drive circuit is programmed to have an output voltage swing greater than the output voltage swing of the second output drive circuit by a factor that is greater than 1.7 and less than 2.3.

In one embodiment, the power combiner is a resistive power combiner.

In one embodiment, the power combiner is a reactive power combiner.

In one embodiment, the power combiner includes two coupled transmission lines.

In one embodiment, the first output drive circuit is part of a first transceiver of the field-programmable gate array, the second output drive circuit is part of a second transceiver of the field-programmable gate array, and the first transceiver and the second transceiver are within one bank of transceivers of the field-programmable gate array.

In one embodiment, the first transceiver is bonded to the second transceiver at the physical coding sublayer.

In one embodiment, the first transceiver is bonded to the second transceiver at the physical medium attachment sublayer.

In one embodiment, the analog includes a filter, connected to the output of the power combiner.

In one embodiment, the filter is a low pass filter.

In one embodiment, the filter is a multilayer filter.

In one embodiment, the first output of the field-programmable gate array is a differential output, the power combiner is connected to the first output of the field-programmable gate array through a first balun, the second output of the field-programmable gate array is a differential output, and the power combiner is connected to the second output of the field-programmable gate array through a second balun.

In one embodiment, the first output of the field-programmable gate array is a differential output including a first conductor and a second conductor, the power combiner is connected to the first conductor of the first output of the field-programmable gate array, the second output of the field-programmable gate array is a differential output including a first conductor and a second conductor, and the power combiner is connected to the first conductor of the second output of the field-programmable gate array.

In one embodiment, the field-programmable gate array further includes a third output drive circuit connected to a third output of the field-programmable gate array, and the power combiner further has a third input connected to the third output of the field-programmable gate array.

In one embodiment, each of: the first output drive circuit, the second output drive circuit, and the third output drive circuit has an output voltage swing programmable with a resolution of five bits.

In one embodiment, the first output drive circuit is programmed to have an output voltage swing equal to 28/31 of a maximum available output voltage swing, the second output drive circuit is programmed to have an output voltage swing equal to 14/31 of the maximum available output voltage swing, and the third output drive circuit is programmed to have an output voltage swing equal to 7/31 of the maximum available output voltage swing.

In one embodiment, the first output drive circuit is programmed to have an output voltage swing equal to a maximum available output voltage swing, the second output drive circuit is programmed to have an output voltage swing equal to 16/31 of the maximum available output voltage swing, and the third output drive circuit is programmed to have an output voltage swing equal to 8/31 of the maximum available output voltage swing.

In one embodiment, the field-programmable gate array further includes: a fourth output drive circuit connected to a fourth output of the field-programmable gate array; a fifth output drive circuit connected to a fifth output of the field-programmable gate array; and a sixth output drive circuit connected to a sixth output of the field-programmable gate array, wherein: the power combiner further has: a fourth input connected to the fourth output of the field-programmable gate array; a fifth input connected to the fifth output of the field-programmable gate array; and a sixth input connected to the sixth output of the field-programmable gate array, the fourth output drive circuit is programmed to have an output voltage swing equal to 4/31 of the maximum available output voltage swing, the fifth output drive circuit is programmed to have an output voltage swing equal to 2/31 of the maximum available output voltage swing, and the sixth output drive circuit is programmed to have an output voltage swing equal to 1/31 of the maximum available output voltage swing.

In one embodiment, each of: the first output drive circuit, the second output drive circuit, and the third output drive circuit is configured to transmit data at a rate greater than 20 Gb/s.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a system for generating analog output from a field programmable gate array provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

In some embodiments, a field programmable gate array (FPGA) includes a plurality of high-speed serial data transceivers, each including a high-speed transmitter configured to transmit serial data at high data rates (e.g., data rates exceeding 20 Gb/s). For example, a XILINX® VIRTEX®-7 field programmable gate array may include 28 or more transceivers capable of operating at serial data rates of 12.5 Gb/s or more, and an ALTERA® STRATIX® 10 may include a plurality of transceivers capable of operating at serial data rates of 17.4 Gb/s, 28.3 Gb/s or 30 Gb/s. Each such transmitter may include an output drive circuit connected to an output pin of the field programmable gate array. The output drive circuit may have a programmable output voltage swing, e.g., a voltage swing that may be programmed by setting a register in the field programmable gate array.

Figure 1A:
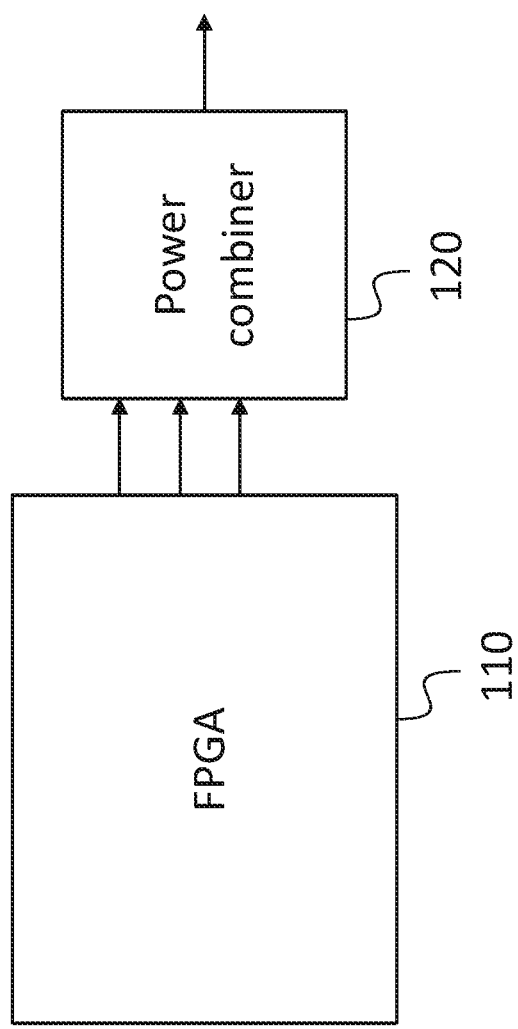
FIG. 1A is a block diagram of a circuit for generating an analog output signal from a field programmable gate array, according to an embodiment of the present invention.

Two or more transmitter outputs may be configured to generate signals with different voltage swings, and the outputs may be combined, e.g., with a power combiner, as shown in FIG. 1A. In FIG. 1A, three outputs of FPGA 110 are configured to have voltage swings differing approximately by factors of two, so that, e.g., a first transmitter output (i.e., a first output drive circuit of a first transmitter and connected to a first output of the FPGA 110) is programmed to have a first voltage swing (e.g., 1.0 V), a second transmitter output (i.e., a second output drive circuit of a second transmitter and connected to a second output of the FPGA 110) is programmed to have a second voltage swing (e.g., 0.5 V) that is approximately one half of the first voltage swing, and a third transmitter output (i.e., a third output drive circuit of a third transmitter and connected to a third output of the FPGA 110) is programmed to have a third voltage swing (e.g., 0.25 V) that is approximately one half of the second voltage swing. The three transmitters are driven by respective bits of a three bit digital waveform, and their output voltages are summed by a power combiner 120 having three inputs and one output, as shown. The output of the power combiner 120 is an analog voltage corresponding to the digital waveform, as discussed in greater detail below, with reference to FIGS. 2A-2C. Each input of the power combiner 120 is connected to a respective output of the FPGA 110. As such, the three transmitters, programmed as described above, together with the power combiner 120, form a circuit that operates as a three-bit digital to analog converter.

The power combiner may be a resistive combiner, e.g., a Pulsar model P4-12-E four-way surface mount power divider or a Pulsar model PS4-09-452/3N power divider with N-type connectors. In an embodiment in which more than four outputs of the field programmable gate array 110 are used to form a circuit that operates as a digital to analog converter with more than four bits of resolution, an otherwise similar power combiner 120 with more than four inputs may be used. In an embodiment in which fewer than four outputs of the field programmable gate array 110 are used to form a circuit that operates as a digital to analog converter with fewer than four bits of resolution, an otherwise similar power combiner with fewer than four inputs may be used, or unused inputs of a four-input power combiner may be terminated, e.g., with a suitable resistor. In other embodiments, a different type of combiner, e.g., a reactive power combiner, a transformer-based power combiner, or a power combiner using coupled transmission lines may be used instead of a resistive power combiner. Such alternate power combiners may have lower loss than a resistive power combiner, although they may be less broadband, and they may not be DC-coupled.

Figure 1B:
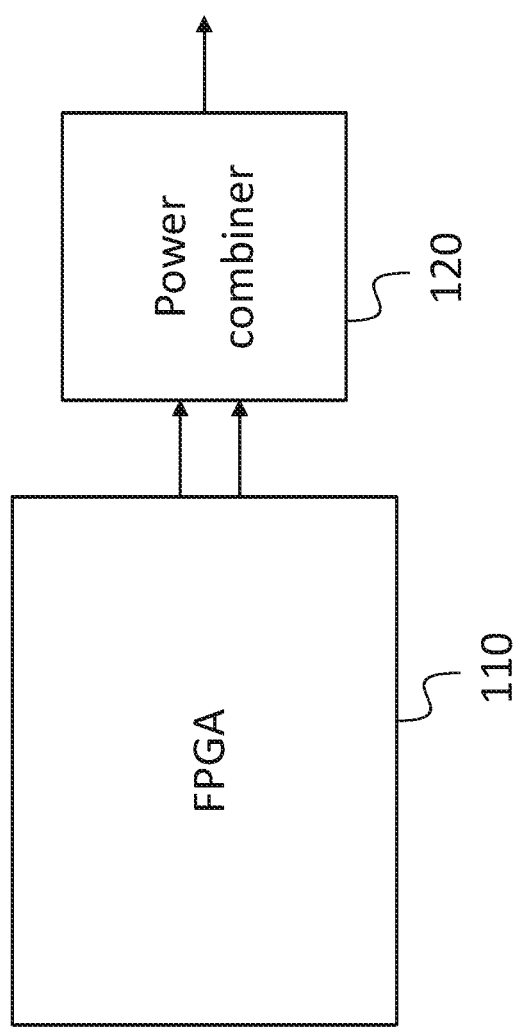
FIG. 1B is a block diagram of a circuit for generating an analog output signal from a field programmable gate array, according to an embodiment of the present invention.
Figure 1C:
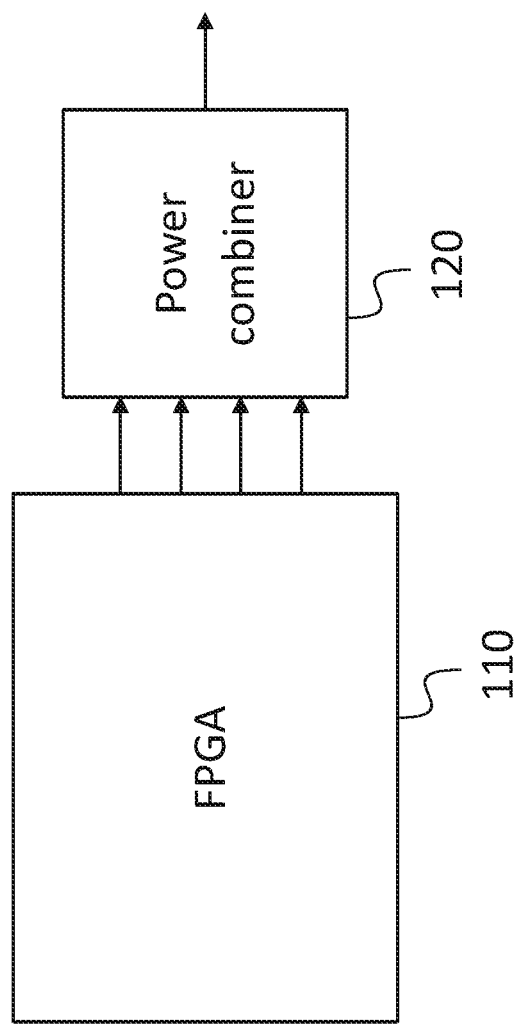
FIG. 1C is a block diagram of a circuit for generating an analog output signal from a field programmable gate array, according to an embodiment of the present invention.

A similar circuit that operates as a two-bit digital to analog converter may be implemented as shown in FIG. 1B. In the embodiment of FIG. 1B, a first transmitter output of an FPGA 110 is programmed to have a first voltage swing (e.g., 1.0 V) and a second transmitter output is programmed to have a second voltage swing (e.g., 0.5 V) that is approximately one half of the first voltage swing. The two outputs are combined with a power combiner 120 having two inputs and one output, as shown. In another embodiment, illustrated in FIG. 1C, a circuit that operates as a four-bit digital to analog converter is implemented using four outputs of the FPGA 110 and a power combiner 120 with four inputs and one output. In a manner analogous to that of the embodiments of FIGS. 1A and 1B, in the embodiment of FIG. 1C, a first transmitter output of the FPGA 110 is programmed to have a first voltage swing, a second transmitter output is programmed to have a second voltage swing that is approximately one half of the first voltage swing, a third transmitter output is programmed to have a third voltage swing that is approximately one half of the second voltage swing, and a fourth transmitter output is programmed to have a fourth voltage swing that is approximately one half of the third voltage swing.

The FPGA 110 may be any suitable FPGA 110 with two or more serial transceivers, such as a XILINX® 7-series FPGA or an ALTERA® STRATIX® 10 FPGA. In such devices the transceivers may be organized into banks for purposes of synchronization. The transceivers within each bank may be configured to be bonded together (i.e., synchronized to each other) at the physical coding sublayer (PCS) and/or at the physical medium attachment (PMA) sublayer. Bonding the transceivers together may reduce the error in the analog output voltage which otherwise may occur during the interval between the switching of two transceivers when the two transceivers are not synchronized. Each transceiver may be configured to transmit the received data without modification, e.g., 8b/10b encoding may be disabled.

The voltage swings available in the transceiver output drive circuits of a FPGA may be ones for which a swing that is one half of the maximum available voltage swing is not available. For example, a XILINX® 7-series FPGA may have a maximum transceiver output voltage swing of 1.119 $V_{PPD}$, and a voltage swing of one half of this value, i.e., 0.5595 $V_{PPD}$ may not be available. Instead the nearest available voltages may be 0.543 $V_{PPD}$ (differing from 0.5595 $V_{PPD}$ by about three percent) and 0.609 $V_{PPD}$ (differing from the 0.5595 $V_{PPD}$ by about nine percent). Further, the minimum voltage swing in such a FPGA transceiver output may be 0.269 $V_{PPD}$, which is about four percent greater than one quarter of the maximum voltage swing (of 1.119 $V_{PPD}$). In a three-bit digital to analog converter, these deviations from perfect linearity may be acceptable, however, because they are significantly smaller than the voltage change (about 14% of the maximum voltage swing) corresponding to an increase of one in the digital input to the digital to analog converter. In some embodiment, each ratio of programmable voltage swings that is nominally two is not precisely two, but falls in a range, e.g., each such ratio is between 1.7 and 2.3.

For low-frequency output, the digital waveform may be pre-distorted to compensate for known component of the imperfections in digital to analog converter by advancing or delaying transitions in the digital waveform. For example, a desired waveform at the output of the combiner may be more faithfully produced if a transition to a digital value of binary 010 is delayed in falling portions of the desired waveform until (or advanced, in rising portions of the desired waveform, to a time at which) the desired voltage at the output of the combiner is 0.543 $V_{out}$ (instead of making the transition at the point in time at which the desired voltage at the output of the combiner is 0.5595 $V_{out}$), where $V_{out}$ is the voltage at the output of the combiner when the outputs from the three transmitters correspond to binary 100. In another embodiment, a similar effect is achieved by setting a different (non-binary weighted) threshold for each of the bits.

Similarly, an ALTERA® STRATIX® 10 field programmable gate array may have 32 available voltage swings ranging from zero to the transceiver supply voltage VCCT in steps of 1/31 of VCCT. As such, if a first transceiver output drive circuit (corresponding to the most significant bit) is configured to have a voltage swing that is the maximum available, i.e., VCCT, then the transceiver output drive circuits corresponding to the second-most significant bit may be programmed to have a voltage swing that is 15/31 of that of the first transceiver output drive circuit, or to have a voltage swing that is 16/31 of that of the first transceiver output drive circuit, but a voltage swing that is one half of VCCT is not available. In this case, too, the deviation from perfect linearity that results from either of these two options may be acceptable, even if a circuit that operates as four-bit digital to analog converter is implemented. Another possibility, with the ALTERA® STRATIX® 10 field programmable gate array, may be to program the transceiver output drive circuit corresponding to the most significant bit to have a voltage swing that is 28/31 VCCT (with the voltage swings of the other transceiver output drive circuits being programmed to be 14/31 VCCT, and 7/31 VCCT, respectively) if a three-bit digital to analog converter is being implemented, or to program the transceiver output drive circuit corresponding to the most significant bit to have a voltage swing that is 24/31 VCCT (with the voltage swings of the other transceiver output drive circuits being programmed to be 12/31 VCCT, 6/31 VCCT, and 3/31 VCCT, respectively) if a four-bit digital to analog converter is being implemented.

Figure 1D:
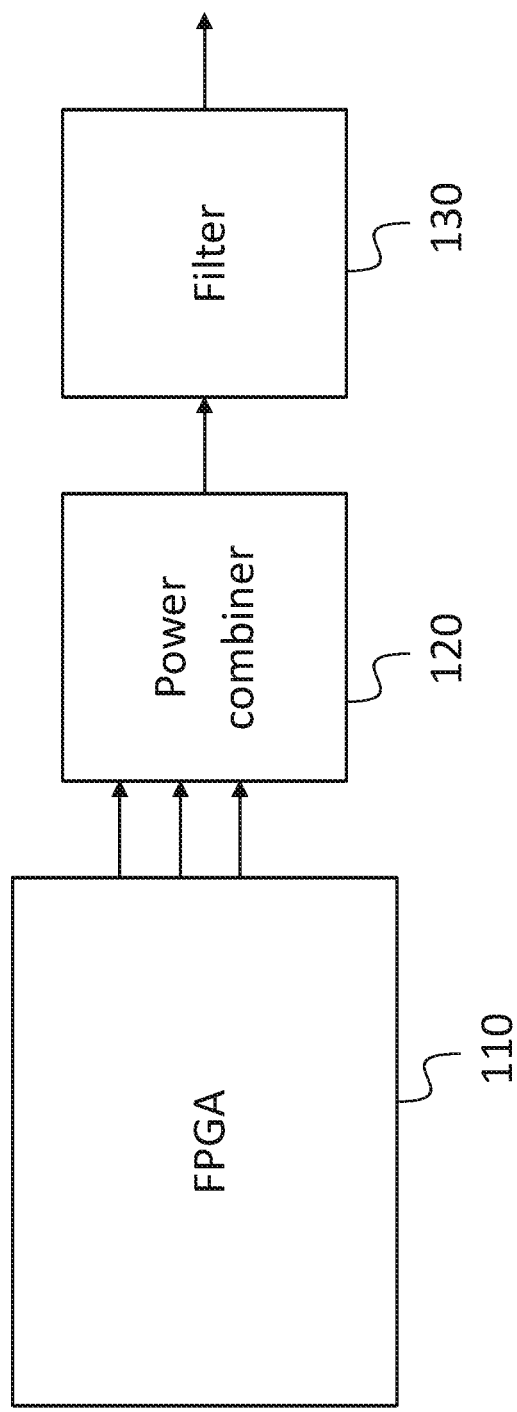
FIG. 1D is a block diagram of a circuit for generating an analog output signal from a field programmable gate array, according to an embodiment of the present invention.

Referring to FIG. 1D, an antialiasing filter 130 may be connected to the output of the power combiner 120 in any of the embodiments described herein, to suppress frequency components, that may be present at the output of the power combiner 120, e.g., at frequencies that are the sum or difference of a desired output frequency component and the sampling frequency and harmonics of the sampling frequency. For example, the filter may be a multilayer low pass filter such as a TDK® model DEA162025LT-5003C3 surface mount multilayer low pass filter or a TAIYO YUDEN® model FI168L1681G6-T high frequency multilayer low pass filter. In some embodiments, the antialiasing filter 130 is a low pass filter with a corner frequency at or below the Nyquist frequency (the Nyquist frequency being one half of the sampling frequency).

Figure 1E:
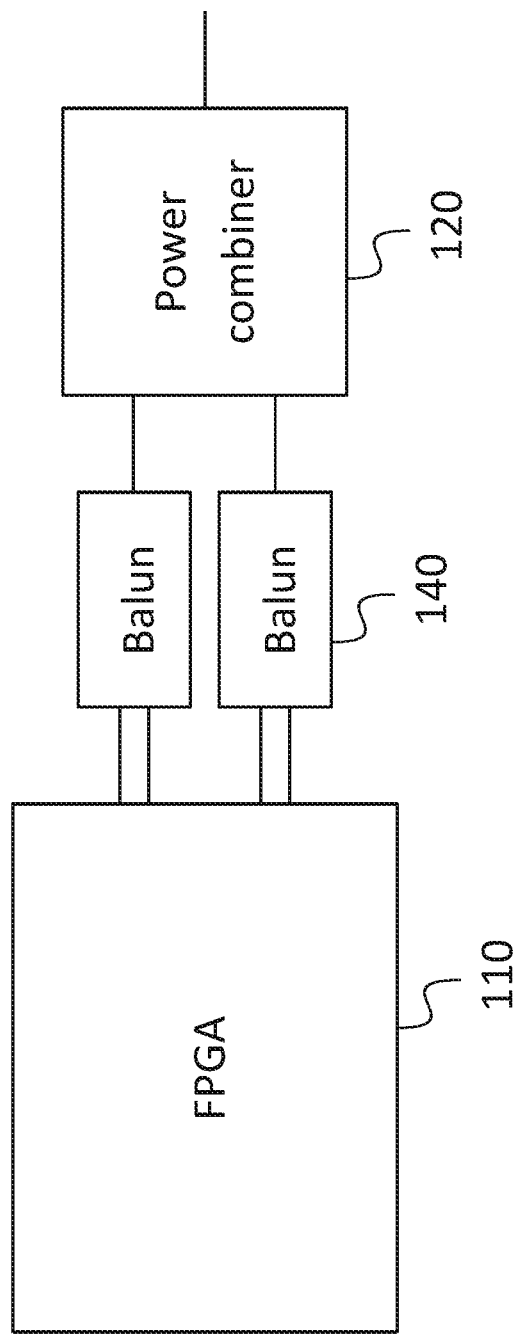
FIG. 1E is a block diagram of a circuit for generating an analog output signal from a field programmable gate array, according to an embodiment of the present invention.
Figure 1F:
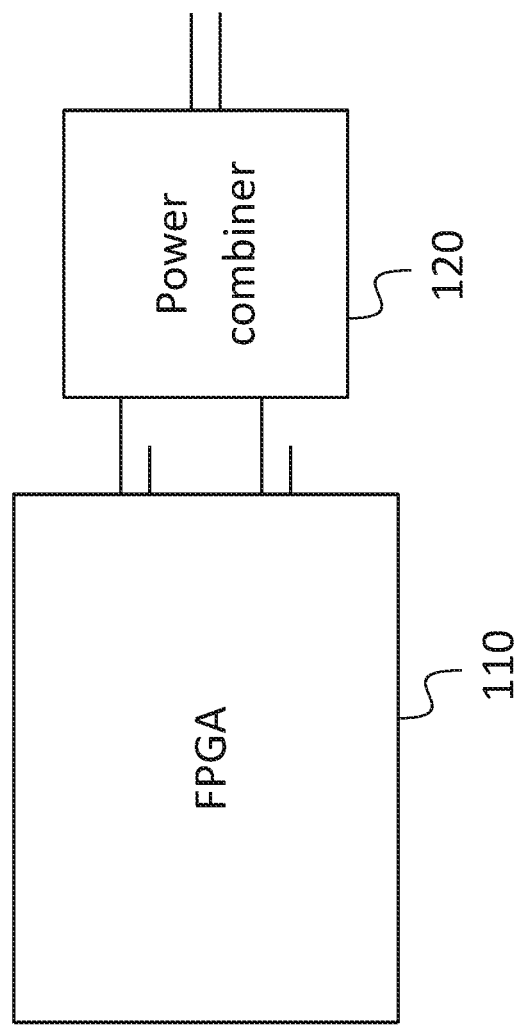
FIG. 1F is a block diagram of a circuit for generating an analog output signal from a field programmable gate array, according to an embodiment of the present invention.

Referring to FIG. 1E, in some embodiments the output of each transceiver of the FPGA 110 may be a pair of conductors driven with differential voltages (i.e., a balanced signal). If the power combiner 120 has single-ended (i.e., unbalanced) inputs (each referenced to ground), then a balun 140 may be connected between each differential output of the FPGA 110 and each single-ended input of the power combiner, as shown. In other embodiments, baluns are not used, and one of the two conductors of the differential output is connected to the power combiner 120, and the other is terminated (e.g., with 50 ohms) or left unconnected (as shown in FIG. 1F). In FIGS. 1A-1D, arrows (i.e., lines with arrowheads) represent signal flows (e.g., as either single-ended or differential signals) and in FIGS. 1E and 1F, simple lines (i.e., lines without arrowheads) represent conductors.

Figure 2A:
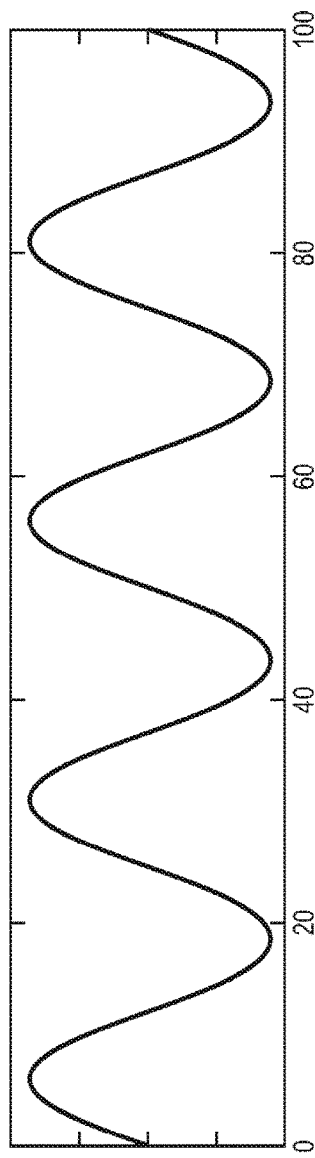
FIG. 2A is a waveform diagram, according to an embodiment of the present invention.
Figure 2B:
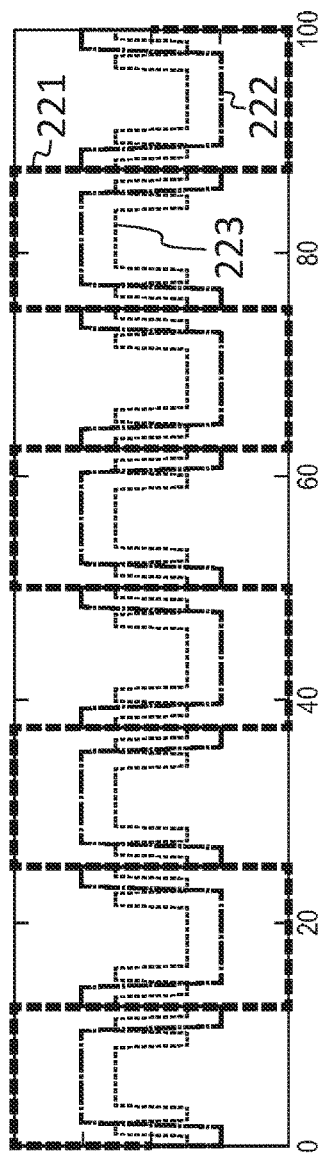
FIG. 2B is a waveform diagram, according to an embodiment of the present invention.
Figure 2C:
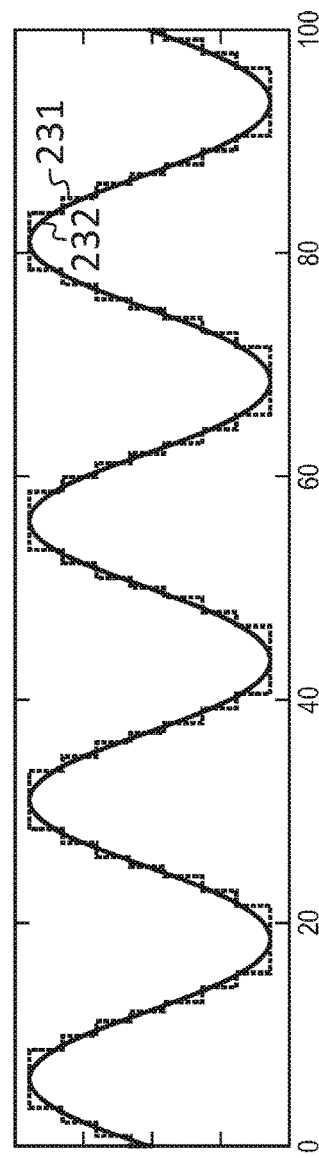
FIG. 2C is a waveform diagram, according to an embodiment of the present invention.

FIGS. 2A-2C show an example of how a desired output waveform may be approximated by an output signal from a circuit that operates as a three-bit digital to analog converter, such as that shown in FIGS. 1A and 1D. FIG. 2A shows the desired waveform, FIG. 2B shows the output of a first transceiver of the FPGA 110 (in a waveform 221) that has a first voltage swing, the output of a second transceiver of the FPGA 110 (in a waveform 222) that has a second voltage swing which is about half of the first voltage swing, and the output of a third transceiver of the FPGA 110 (in a waveform 223) that has a third voltage swing which is about half of the second voltage swing. FIG. 2C shows the result (in a waveform 231) of adding the three waveforms of FIG. 2B, overlaid on the desired waveform 232.

Embodiments of the present invention may be used in various commercial applications in which high-speed analog outputs, are needed, without incurring significant cost, or mass and power penalties. For example, some embodiments may be used in software-defined radios, and other wireless communications systems such as cell phone, WiFi, and Bluetooth systems, or in other applications such as toll road vehicle trackers and RFID systems.

Although limited embodiments of a system for generating analog output from a field programmable gate array have been specifically described and illustrated herein, many modifications and variations will be apparent to those skilled in the art. Accordingly, it is to be understood that a system for generating analog output from a field programmable gate array employed according to principles of this invention may be embodied other than as specifically described herein. The invention is also defined in the following claims, and equivalents thereof.

What is claimed is:

1. An analog signal generator, comprising:
    a field-programmable gate array comprising:
        a first output drive circuit connected to a first output of the field-programmable gate array; and
        a second output drive circuit connected to a second output of the field-programmable gate array; and
    a power combiner having:
        an output,
        a first input directly connected to the first output of the field-programmable gate array, and
        a second input directly connected to the second output of the field-programmable gate array,
    each of the first output drive circuit and the second output drive circuit having a programmable output voltage swing, the first output drive circuit being programmed to have an output voltage swing greater than the output voltage swing of the second output drive circuit.

2. An analog signal generator, comprising:
    a field-programmable gate array comprising:
        a first output drive circuit connected to a first output of the field-programmable gate array; and
        a second output drive circuit connected to a second output of the field-programmable gate array; and
    a power combiner having:
        an output,
        a first input connected to the first output of the field-programmable gate array, and
        a second input connected to the second output of the field-programmable gate array,
    each of the first output drive circuit and the second output drive circuit having a programmable output voltage swing, the first output drive circuit being programmed to have an output voltage swing greater than the output voltage swing of the second output drive circuit,
    wherein:
        the first output drive circuit is part of a first transceiver of the field-programmable gate array,
        the second output drive circuit is part of a second transceiver of the field-programmable gate array,
        the first transceiver and the second transceiver are within one bank of transceivers of the field-programmable gate array, and
        the first transceiver is bonded to the second transceiver at the physical medium attachment sublayer.

3. The analog signal generator of claim 2, wherein the first output drive circuit is programmed to have an output voltage swing greater than the output voltage swing of the second output drive circuit by a factor that is greater than 1.7 and less than 2.3.

4. The analog signal generator of claim 2, wherein the power combiner is a resistive power combiner.

5. The analog signal generator of claim 2, wherein the power combiner is a reactive power combiner.

6. The analog signal generator of claim 2, wherein the power combiner comprises two coupled transmission lines.

7. The analog signal generator of claim 2, wherein:
    the first output drive circuit is part of a first transceiver of the field-programmable gate array,
    the second output drive circuit is part of a second transceiver of the field-programmable gate array, and
    the first transceiver and the second transceiver are within one bank of transceivers of the field-programmable gate array.

8. The analog signal generator of claim 2, further comprising a filter, connected to the output of the power combiner.

9. The analog signal generator of claim 8, wherein the filter is a low pass filter.

10. The analog signal generator of claim 9, wherein the filter is a multilayer filter.

11. The analog signal generator of claim 2, wherein:
    the first output of the field-programmable gate array is a differential output,
    the power combiner is connected to the first output of the field-programmable gate array through a first balun,
    the second output of the field-programmable gate array is a differential output, and
    the power combiner is connected to the second output of the field-programmable gate array through a second balun.

12. The analog signal generator of claim 2, wherein:
    the field-programmable gate array further comprises a third output drive circuit connected to a third output of the field-programmable gate array, and
    the power combiner further has a third input connected to the third output of the field-programmable gate array.

13. The analog signal generator of claim 12, wherein each of:
    the first output drive circuit,
    the second output drive circuit, and
    the third output drive circuit has an output voltage swing programmable with a resolution of five bits.

14. The analog signal generator of claim 13, wherein:
    the first output drive circuit is programmed to have an output voltage swing equal to 28/31 of a maximum available output voltage swing,
    the second output drive circuit is programmed to have an output voltage swing equal to 14/31 of the maximum available output voltage swing, and the third output drive circuit is programmed to have an output voltage swing equal to 7/31 of the maximum available output voltage swing.

15. The analog signal generator of claim 13, wherein:
the first output drive circuit is programmed to have an output voltage swing equal to a maximum available output voltage swing,
the second output drive circuit is programmed to have an output voltage swing equal to 16/31 of the maximum available output voltage swing, and
the third output drive circuit is programmed to have an output voltage swing equal to 8/31 of the maximum available output voltage swing.

16. The analog signal generator of claim 13, wherein:
the field-programmable gate array further comprises:
  a fourth output drive circuit connected to a fourth output of the field-programmable gate array;
  a fifth output drive circuit connected to a fifth output of the field-programmable gate array; and
  a sixth output drive circuit connected to a sixth output of the field-programmable gate array,
wherein:
  the power combiner further has:
    a fourth input connected to the fourth output of the field-programmable gate array;
    a fifth input connected to the fifth output of the field-programmable gate array; and
    a sixth input connected to the sixth output of the field-programmable gate array,
  the fourth output drive circuit is programmed to have an output voltage swing equal to 4/31 of the maximum available output voltage swing,
  the fifth output drive circuit is programmed to have an output voltage swing equal to 2/31 of the maximum available output voltage swing, and
  the sixth output drive circuit is programmed to have an output voltage swing equal to 1/31 of the maximum available output voltage swing.

17. The analog signal generator of claim 12, wherein each of:
the first output drive circuit,
the second output drive circuit, and
the third output drive circuit
is configured to transmit data at a rate greater than 20 Gb/s.

18. The analog signal generator of claim 2, wherein the first transceiver is further bonded to the second transceiver at the physical coding sublayer.

19. An analog signal generator, comprising:
a field-programmable gate array comprising:
  a first output drive circuit connected to a first output of the field-programmable gate array; and
  a second output drive circuit connected to a second output of the field-programmable gate array; and
a power combiner having:
  an output,
  a first input connected to the first output of the field-programmable gate array, and
  a second input connected to the second output of the field-programmable gate array,
each of the first output drive circuit and the second output drive circuit having a programmable output voltage swing, the first output drive circuit being programmed to have an output voltage swing greater than the output voltage swing of the second output drive circuit,
wherein:
  the first output of the field-programmable gate array is a differential output comprising a first conductor and a second conductor,
  the power combiner is connected to the first conductor of the first output of the field-programmable gate array,
  the second output of the field-programmable gate array is a differential output comprising a first conductor and a second conductor, and
  the power combiner is connected to the first conductor of the second output of the field-programmable gate array.

* * * * *